(12) United States Patent
Park et al.

(10) Patent No.: US 7,482,242 B2
(45) Date of Patent: Jan. 27, 2009

(54) CAPACITOR, METHOD OF FORMING THE SAME, SEMICONDUCTOR DEVICE HAVING THE CAPACITOR AND METHOD OF MANUFACTURING THE SAME

(75) Inventors: Hong-Bum Park, Suwon-si (KR); Woo-Sung Lee, Yongin-si (KR); Nam-Kyu Kim, Suwon-si (KR); Jung-Hee Chung, Seoul (KR); Jae-Hyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 83 days.

(21) Appl. No.: 11/523,514

(22) Filed: Sep. 20, 2006

(65) Prior Publication Data

US 2007/0066015 A1 Mar. 22, 2007

(30) Foreign Application Priority Data

Sep. 21, 2005 (KR) .................. 10-2005-0087496

(51) Int. Cl.
*H01L 21/20* (2006.01)
(52) U.S. Cl. .................. 438/396; 438/393; 438/399; 257/E21.011
(58) Field of Classification Search .......... 257/296, 257/298, 300, 301, 302, 303, 306; 438/386, 438/387, 389, 393, 395, 396, 397, 398, 399
See application file for complete search history.

(56) References Cited

U.S. PATENT DOCUMENTS

| | | | |
|---|---|---|---|
| 5,895,261 A * | 4/1999 | Schinella et al. | 438/586 |
| 6,171,902 B1 | 1/2001 | Ida | |
| 6,229,166 B1 * | 5/2001 | Kim et al. | 257/295 |
| 6,441,423 B1 * | 8/2002 | Mandelman et al. | 257/301 |
| 2002/0025650 A1 * | 2/2002 | Thakur et al. | 438/398 |

(Continued)

FOREIGN PATENT DOCUMENTS

JP 2004-327493 11/2004

(Continued)

*Primary Examiner*—Thao X Le
*Assistant Examiner*—Robert Huber
(74) *Attorney, Agent, or Firm*—Harness, Dickey & Pierce, PLC

(57) ABSTRACT

Example embodiments relate to a capacitor, a method of forming the same, a semiconductor device having the capacitor and a method of manufacturing the same. Other example embodiments are directed to a capacitor having an upper electrode structure including a first upper electrode and a second upper electrode, a method of forming the same, a semiconductor device having the capacitor and a method of manufacturing the same. In a method of forming a capacitor, a lower electrode may be formed on a substrate, and then a dielectric layer may be formed on the lower electrode. An upper electrode structure may be formed on the dielectric layer. The upper electrode structure may include a first upper electrode and a second upper electrode. The second upper electrode may include at least two of a silicon layer, a first silicon germanium layer and a second silicon germanium layer doped with p-type impurities. The upper electrode structure may be formed without generating voids between the dielectric layer and the upper electrode structure. The capacitor and the semiconductor device having the upper electrode structure may have improved electrical characteristics.

4 Claims, 10 Drawing Sheets

U.S. PATENT DOCUMENTS

2004/0259308 A1  12/2004  Chung et al.

FOREIGN PATENT DOCUMENTS

| KR | 10-2001-0057386 | 7/2001 |
| KR | 1020010087183 | 9/2001 |
| KR | 10-2004-0088911 | 10/2004 |
| KR | 1020040088911 | 10/2004 |

* cited by examiner

CAPACITOR, METHOD OF FORMING THE SAME, SEMICONDUCTOR DEVICE HAVING THE CAPACITOR AND METHOD OF MANUFACTURING THE SAME

PRIORITY STATEMENT

This application claims priority under 35 USC § 119 to Korean Patent Application No. 2005-87496, filed on Sep. 21, 2005, in the Korean Intellectual Property Office (KIPO), the entire contents of which are incorporated herein by reference.

BACKGROUND

1. Field of the Invention

Example embodiments relate to a capacitor, a method of forming the same, a semiconductor device having the capacitor and a method of manufacturing the same. Other example embodiments are directed to a capacitor having an upper electrode structure including a first upper electrode and a second upper electrode, a method of forming the same, a semiconductor device having the capacitor and a method of manufacturing the same.

2. Description of the Related Art

Among semiconductor devices, a dynamic random access memory (DRAM) device may have a unit cell including one access transistor and one storage capacitor. As the DRAM device becomes more highly integrated, the capacitor dimension may be reduced. The capacitor may increase storage capacity regardless of the reduced size of the DRAM device.

The capacity of the capacitor may be represented by the following equation:

$$C = \epsilon_0 \epsilon \times (A/d)$$

wherein $\epsilon_0$ indicates a dielectric constant in a vacuum, and $\epsilon$ indicates a dielectric constant of a dielectric layer. A represents an effective area of a lower electrode, and d indicates a thickness of the dielectric layer.

As shown in the above equation, the capacity of the capacitor may be improved by increasing the effective area of the lower electrode, reducing the thickness of the dielectric layer and/or employing relatively high dielectric material as the dielectric layer. The lower electrode of the capacitor may have a cylindrical structure that has a height larger than a width thereof, thereby increasing the capacity of the capacitor.

In a conventional method of forming a cylindrical capacitor, an insulating interlayer having a contact pad may be formed on a semiconductor substrate, and then a cylindrical lower electrode having a relatively high aspect ratio may be formed on the contact pad. After a dielectric layer is formed on the cylindrical lower electrode, an upper electrode may be formed on the dielectric layer. The upper electrode may include a polysilicon germanium layer doped with p-type impurities.

The p-type polysilicon germanium layer of the upper electrode may be directly formed on the dielectric layer without forming a seed layer so that the size of the grains in the p-type polysilicon germanium layer may be undesirably increased. Voids may be generated between the dielectric layer and the upper electrode because the p-type polysilicon germanium layer having the relatively large grains may not be properly formed on the dielectric layer. When the voids are formed between the dielectric layer and the upper electrode, electrical characteristics of the capacitor may be deteriorated.

SUMMARY

Example embodiments relate to a capacitor, a method of forming the same, a semiconductor device having the capacitor and a method of manufacturing the same. Other example embodiments are directed to a capacitor having an upper electrode structure including a first upper electrode and a second upper electrode, a method of forming the same, a semiconductor device having the capacitor and a method of manufacturing the same.

According to example embodiments, there is provided a capacitor including a lower electrode, a dielectric layer formed on the lower electrode, and an upper electrode structure formed on the dielectric layer. The upper electrode structure may include a first upper electrode and a second upper electrode. The second upper electrode may include at least two of a silicon layer, a first silicon germanium layer and a second silicon germanium layer doped with p-type impurities.

In example embodiments, the second upper electrode of the upper electrode structure may include the silicon layer formed on the first upper electrode and the first silicon germanium layer formed on the silicon layer. The second upper electrode of the upper electrode structure may include the first silicon germanium layer formed on the first upper electrode and the second silicon germanium layer formed on the first silicon germanium layer. The second upper electrode of the upper electrode structure may include the silicon layer formed on the first upper electrode, the first silicon germanium layer formed on the silicon layer, and the second silicon germanium layer formed on the first silicon germanium layer. In example embodiments, the p-type impurities of the second silicon germanium layer may include boron (B). The lower electrode and the first upper electrode may include titanium nitride.

According to other example embodiments, there is provided a method of forming a capacitor. A lower electrode may be formed on an object, and then a dielectric layer may be formed on the lower electrode. An upper electrode structure may be formed on the dielectric layer. The upper electrode structure may include a first upper electrode and a second upper electrode. The second upper electrode may include at least two of a silicon layer, a first silicon germanium layer and a second silicon germanium layer doped with p-type impurities.

In example embodiments, the second upper electrode of the upper electrode structure may be formed by forming the silicon layer on the first upper electrode and forming the first silicon germanium layer on the silicon layer using the silicon layer as a seed layer. The second upper electrode of the upper electrode structure may be formed by forming the first silicon germanium layer on the first upper electrode and forming the second silicon germanium layer on the first silicon germanium layer using the first silicon germanium layer as a seed layer.

In example embodiments, the second upper electrode of the upper electrode structure may be formed by forming the silicon layer on the first upper electrode, forming the first silicon germanium layer on the silicon layer using the silicon layer as a first seed layer, and forming the second silicon germanium layer on the first silicon germanium layer using the first silicon layer as a second seed layer. The second upper electrode of the upper electrode structure may be formed in-situ with the first upper electrode. The second silicon germanium layer doped with the p-type impurities may be formed using an impurity source gas including boron.

According to other example embodiments, there is provided a semiconductor device including a semiconductor substrate having a contact region, at least one pad, a lower electrode, a dielectric layer, and an upper electrode structure having a first upper electrode and a second upper electrode. The at least one pad may make contact with the contact region. The lower electrode may be electrically connected to the contact region through the at least one pad. The dielectric layer may be formed on the lower electrode. The upper electrode structure may be formed on the dielectric layer. The second upper electrode may include at least two of a silicon layer, a first silicon germanium layer and a second silicon germanium layer doped with p-type impurities.

According to still other example embodiments, there is provided a method of manufacturing a semiconductor device. In the method of manufacturing the semiconductor device, a contact region may be formed on a semiconductor substrate and at least one pad may be formed on the contact region. A lower electrode may be formed on the at least one pad. A dielectric layer may be formed on the lower electrode and an upper electrode structure formed on the dielectric layer. The upper electrode structure may include a first upper electrode and a second upper electrode may include at least two of a silicon layer, a first silicon germanium layer and a second silicon germanium layer doped with p-type impurities.

According to example embodiments, a second upper electrode including a silicon germanium layer doped with p-type impurities may be formed on a first upper electrode using at least one seed layer. An upper electrode structure having the second and the first upper electrodes may be formed on a dielectric layer and may reduce undesirable growth of grains in the silicon germanium layer doped with the p-type impurities without generating voids between the dielectric layer and the upper electrode structure. A capacitor and a semiconductor device having the upper electrode structure may have improved electrical characteristics.

BRIEF DESCRIPTION OF THE DRAWINGS

Example embodiments will be more clearly understood from the following detailed description taken in conjunction with the accompanying drawings.

FIGS. 1 and 2 are diagrams illustrating a method of manufacturing a capacitor in accordance with example embodiments;

FIGS. 3 and 4 are diagrams illustrating the method of manufacturing a capacitor in accordance with example embodiments;

FIGS. 5 and 6 are diagrams illustrating the method of manufacturing a capacitor in accordance with example embodiments; and FIGS. 7 to 14 are diagrams illustrating the method of manufacturing a semiconductor device in accordance with example embodiments.

DESCRIPTION OF EXAMPLE EMBODIMENTS

Figure 1:
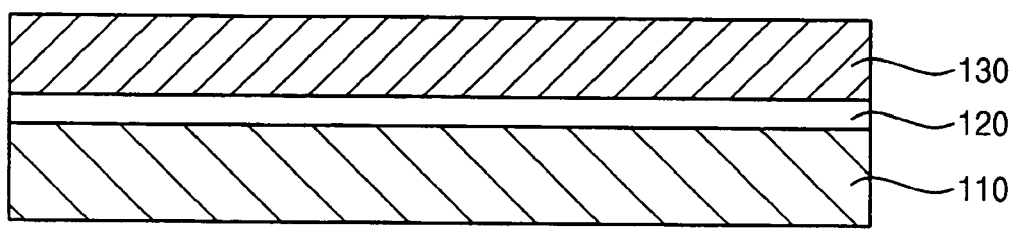
FIGS. 1 to 14 represent non-limiting, example embodiments as described herein.

Example embodiments are described more fully hereinafter with reference to the accompanying drawings. Example embodiments may, however, be embodied in many different forms and should not be construed as limited to the example embodiments set forth herein. Rather, these example embodiments are provided so that this disclosure will be thorough and complete, and will fully convey the scope of the claims to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to a capacitor, a method of forming the same, a semiconductor device having the capacitor and a method of manufacturing the same. Other example embodiments are directed to a capacitor having an upper electrode structure including a first upper electrode and a second upper electrode, a method of forming the same, a semiconductor device having the capacitor and a method of manufacturing the same.

Method of Forming a Capacitor

Figure 2:
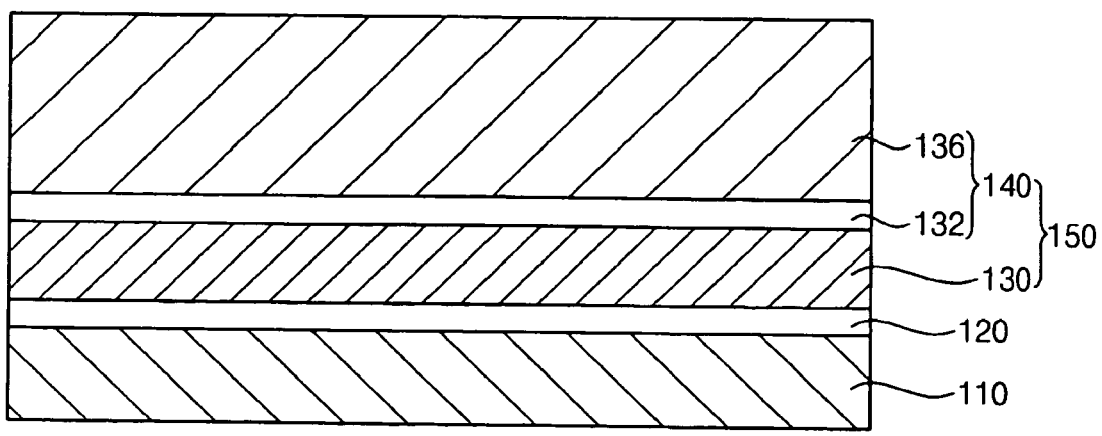

FIGS. 1 and 2 are diagrams illustrating a method of manufacturing a capacitor in accordance with example embodiments. Referring to FIG. 1, a lower electrode 110 may be formed on an object (not shown) (e.g., a substrate). The substrate may include a semiconductor substrate (e.g., a silicon wafer and/or a silicon-on-insulator (SOI) substrate). A lower structure (not shown) may be additionally formed between the object and the lower electrode 110. The lower electrode may include a contact region, a pad, an insulation layer pad, a spacer, an electrode, a plug and/or a transistor.

The lower electrode 110 may be formed using a first conductive material. Examples of the first conductive material may include polysilicon doped with impurities, titanium (Ti), titanium nitride (TiN), tantalum (Ta), tantalum nitride (TaN), tungsten (W), tungsten nitride (WN), aluminum (Al), aluminum nitride (AlN), titanium aluminum nitride (TiAlN) and/or any other suitable material. For example, the lower electrode 110 may be formed using titanium. In some example embodiments, the lower electrode 110 may have a cylindrical shape.

A dielectric layer 120 may be formed on the lower electrode 110. The dielectric layer 120 may be formed using an oxide, a nitride, an oxynitride and/or a metal oxide. The dielectric layer 120 may be formed by a chemical vapor deposition (CVD) process, an atomic layer deposition (ALD) process and/or a plasma enhanced chemical vapor deposition (PECVD) process. For example, the dielectric layer 120 may be formed using silicon oxide ($SiO_x$), silicon nitride ($SiN_x$), silicon oxynitride (SiON), titanium oxynitride (TiON), hafnium oxide ($HfO_x$), zirconium oxide ($ZrO_x$), tantalum oxide ($TaO_x$), yttrium oxide ($YO_x$), niobium oxide ($NbO_x$), aluminum oxide ($AlO_x$), titanium oxide ($TiO_x$), cerium oxide ($CeO_x$), indium oxide ($InO_x$), ruthenium oxide ($RuO_x$), magnesium oxide (MgO), tin oxide ($SnO_x$), lead oxide ($PbO_x$), vanadium oxide ($VO_x$), lanthanum oxide ($LaO_x$), praseodymium oxide ($PrO_x$), stibium oxide ($SbO_x$) and/or calcium oxide (CaO). For example, the dielectric layer 120 may be formed using the metal oxide deposited by the ALD process because the metal oxide may have a relatively thin equivalent oxide thickness (EOT) and a relatively low leakage current.

A first upper electrode 130 may be formed on the dielectric layer 120. The first upper electrode 130 may be formed using a second conductive material. Examples of the second conductive material may include polysilicon doped with impurities, titanium, titanium nitride, tantalum, tantalum nitride, tungsten, tungsten nitride, aluminum, aluminum nitride, titanium aluminum nitride and/or any other suitable material. For example, the first upper electrode 130 may be formed using titanium nitride.

Referring to FIG. 2, a second upper electrode 140 may be formed on the first upper electrode 130. An upper electrode structure 150 may be formed on the dielectric layer 120. The upper electrode structure 150 may include the first upper electrode 130 and the second upper electrode 140. The second upper electrode 140 may include a silicon layer 132 and a silicon germanium layer 136. The silicon germanium layer 136 may be doped with p-type impurities.

In the formation of the second upper electrode 140 according to some example embodiments, the silicon layer 132 may be formed on the first upper electrode 130 as a seed layer for forming the silicon germanium layer 136. The silicon layer 132 may be formed by a low pressure chemical vapor deposition (LPCVD) process using a first silicon source gas. The first silicon source gas may include silicontetrachloride ($SiCl_4$), silane ($SiH_4$), dichlorosilane ($SiH_2Cl_2$), trichlorosilane ($SiHCl_3$) and/or any other suitable compound. These may be used alone or in a mixture thereof. For example, the silicon layer 132 may be formed using the first silicon source gas including silicontetrachloride. The silicon layer 132 may include amorphous silicon and may have a more uniform thickness measured from an upper face of the first upper electrode 130.

After the formation of the silicon layer 132, which may serve as the seed layer, the silicon germanium layer 136 may be formed on the silicon layer 132. The silicon germanium layer 136 having the p-type impurities may be formed by an LPCVD process using a second silicon source gas, a germanium source gas and an impurity source gas including the p-type impurities, for example, boron (B). Examples of the second silicon source gas may include silicontetrachloride, silane, dichlorosilane, trichlorosilane and/or any other suitable compound. These may be used alone or in a mixture thereof. The germanium source gas may include germanium hydride ($GeH_4$), germanium fluoride ($GeF_4$) and/or any other suitable material. The impurity source gas may include boron chloride ($BCl_3$), boron hydride ($B_2H_6$) and/or any other suitable compound. In some example embodiments, the silicon germanium layer 136 may have an impurity concentration of about $1 \times 10^{20}$ ions/cm$^3$ to about $8 \times 10^{20}$ ions/cm$^3$.

In example embodiments, the silicon layer 132 and the silicon germanium layer 136 may be formed in-situ. As described above, the silicon germanium layer 136 may be formed using the silicon layer 132 including amorphous silicon as the seed layer so that the grains in the silicon germanium layer 136 may be adjusted without undesirable growth of the grains.

Figure 3:
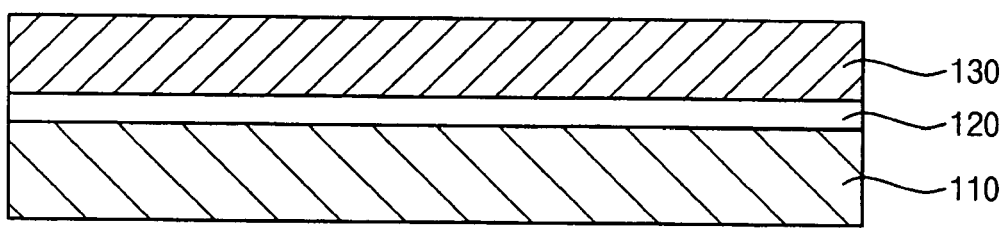
Figure 4:
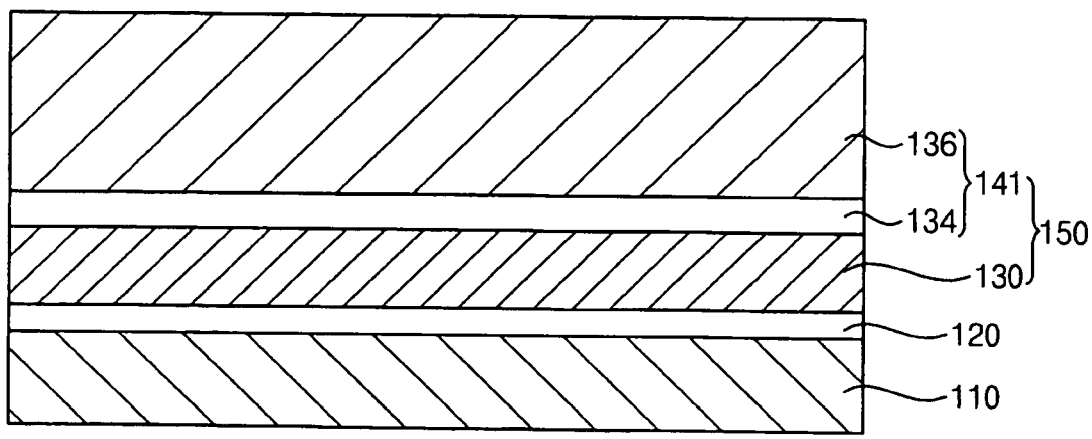

FIGS. 3 and 4 are diagrams illustrating the method of manufacturing a capacitor in accordance with example embodiments. Referring to FIG. 3, a lower electrode 110 may be formed on an object (not shown) (e.g., a semiconductor substrate). The lower electrode 110 may be formed using a first conductive material (e.g., doped polysilicon, a metal and/or a metal nitride). For example, the lower electrode 110 may be formed using titanium nitride. The lower electrode 110 may have a cylindrical shape. A lower structure (not shown) may be formed between the object and the lower electrode 110.

A dielectric layer 120 may be formed on the lower electrode 110. The dielectric layer 120 may be formed using an oxide, a nitride, an oxynitride and/or a metal oxide. For example, the dielectric layer 120 may include the metal oxide deposited by an ALD process. A first upper electrode 130 may be formed on the dielectric layer 120. The first upper electrode 130 may be formed using a second conductive material (e.g., doped polysilicon, a metal and/or a metal nitride). For example, the first upper electrode 130 may be formed using titanium nitride.

Referring to FIG. 4, a second upper electrode 141 may be formed on the first upper electrode 130 to form an upper electrode structure 150 on the dielectric layer 120. The upper electrode structure 150 may include the first and the second upper electrodes 130 and 141.

The second upper electrode 141 may include a first silicon germanium layer 134 and a second silicon germanium layer 136 doped with p-type impurities. The first silicon germanium layer 134 may be formed on the first upper electrode 130 as a seed layer for forming the second silicon germanium layer 136. The first silicon germanium layer 134 may be formed by an LPCVD process using a first silicon source gas and a first germanium source gas. The first silicon source gas may include silicontetrachloride, silane, dichlorosilane and/or trichlorosilane, and the first germanium source gas may include germanium hydride and/or germanium fluoride.

The second silicon germanium layer 136 doped with the p-type impurities (e.g., boron (B)) may be formed on the first silicon germanium layer 134. The second silicon germanium layer 136 may be formed by an LPCVD process using a second silicon source gas, a second germanium source gas and an impurity source gas. The impurity source gas may include boron chloride and/or boron hydride. The second silicon germanium layer 136 may have an impurity concentration of about $1 \times 10^{20}$ ions/cm$^3$ to about $8 \times 10^{20}$ ions/cm$^3$. Because the second silicon germanium layer 136 may be formed using the first silicon germanium layer 134 as the seed layer, grains in the second silicon germanium layer 136 may be adjusted without undesirable growth of the grains.

Figure 5:
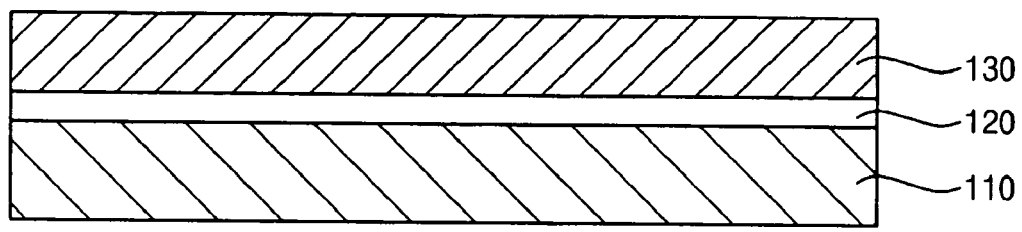
Figure 6:
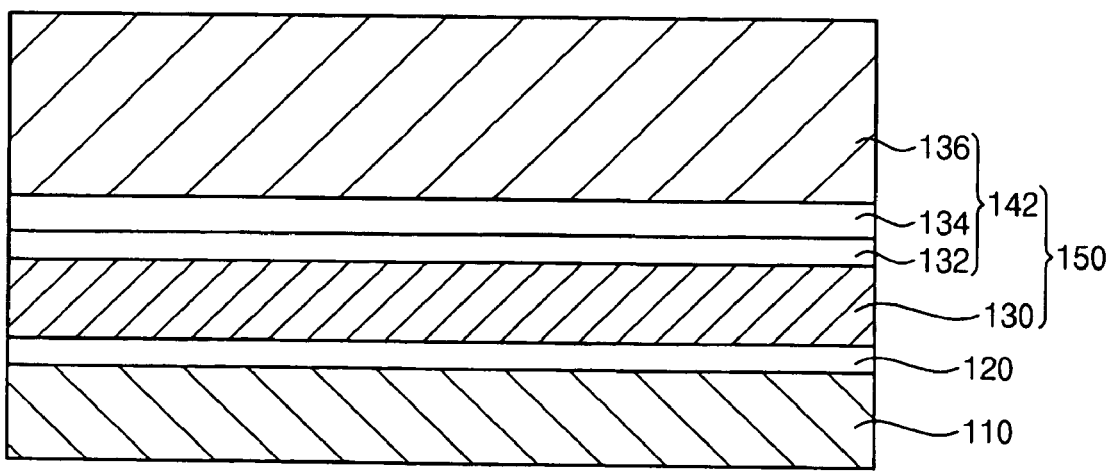

FIGS. 5 and 6 are diagrams illustrating the method of manufacturing a capacitor in accordance with example embodiments. Referring to FIG. 5, a lower electrode 110 may be formed on an object (not shown) (e.g., a semiconductor substrate). The lower electrode 110 may be formed using a first conductive material (e.g., titanium nitride). The lower electrode 110 may have a cylindrical shape. A dielectric layer 120 may be formed on the lower electrode 110. The dielectric layer 120 may be formed using a metal oxide deposited by an ALD process. A first upper electrode 130 may be formed on the dielectric layer 120. The first upper electrode 130 may be formed using a second conductive material (e.g., titanium nitride).

Referring to FIG. 6, a second upper electrode 142 may be formed on the first upper electrode 130 to form an upper electrode structure 150 on the dielectric layer 120. The upper electrode structure 150 may include the first and the second upper electrodes 130 and 142.

The second upper electrode 142 may include a silicon layer 132, a first silicon germanium layer 134 and a second silicon germanium layer 136 doped with p-type impurities. In example embodiments, the silicon layer 132 and the first silicon germanium layer 134 may be formed in-situ. According to other example embodiments, the first silicon germanium layer 134 and the second silicon germanium layer 136 may be formed in-situ. In still other example embodiments, the silicon layer 132, the first silicon germanium layer 134 and the second silicon germanium layer 136 may be formed in-situ.

The silicon layer 132 may be formed on the first upper electrode 130 as a first seed layer for forming the first silicon germanium layer 134. The silicon layer 132 may be formed by an LPCVD process using a first silicon source gas. The first silicon germanium layer 134 may be formed on the silicon layer 132 using the silicon layer 132 as the first seed layer. The first silicon germanium layer 134 may serve as a second seed layer for forming the second silicon germanium layer 136. The first silicon germanium layer 134 may be formed by an LPCVD process using a second silicon source gas and a first germanium source gas.

The second silicon germanium layer 136 doped with the p-type impurities may be formed on the first silicon germanium layer 134 using the first silicon germanium layer 134 as the second seed layer. The second silicon germanium layer 136 doped with boron may be formed by an LPCVD process using a third silicon source gas, a second germanium source gas and an impurity source gas. The second silicon germanium layer 136 may have an impurity concentration of about $1 \times 10^{20}$ ions/cm$^3$ to about $8 \times 10^{20}$ ions/cm$^3$.

After the first silicon germanium layer 134 is formed using the silicon layer 132 as the first seed layer, the second silicon germanium layer 136 may be formed using the first silicon germanium layer 134 as the second seed layer. Grains in the second silicon germanium layer 136 may then be adjusted without undesirable growth of the grains.

Method of Forming a Semiconductor Device Including a Capacitor

Figure 7:
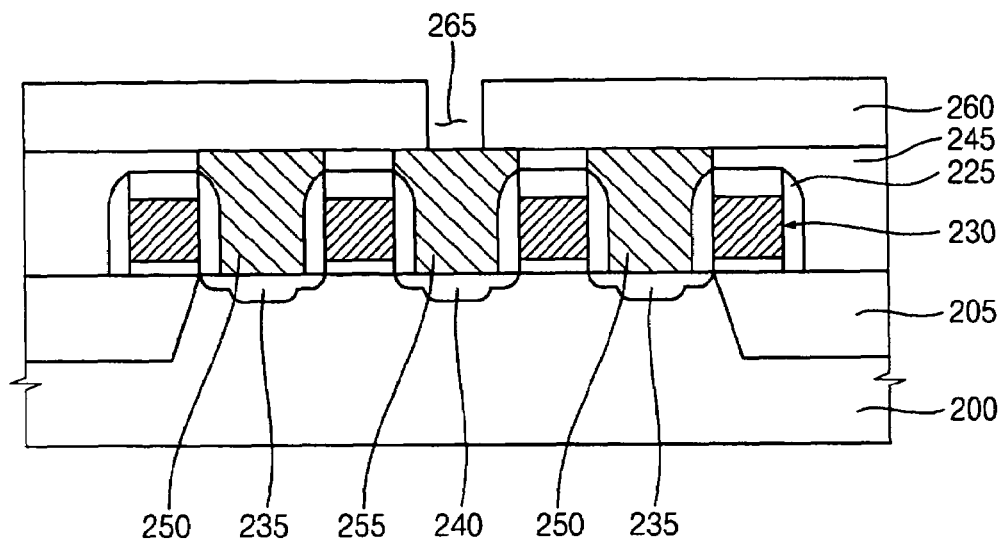

FIGS. 7 to 14 are diagrams illustrating the method of manufacturing a semiconductor device in accordance with example embodiments. Referring to FIG. 7, an isolation layer 205 may be formed on a semiconductor substrate 200 to define an active region and a field region of the semiconductor substrate 200, which may be a silicon wafer and/or an SOI substrate. The isolation layer 205 may be formed by a shallow trench isolation (STI) process.

A gate insulation layer (not shown) may be formed on the substrate 200. The gate insulation layer (not shown) may be formed by a thermal oxidation process, a CVD process and/or an ALD process. The gate insulation layer (not shown) may be formed using silicon oxide and/or a metal oxide having a relatively high dielectric constant. For example, the gate insulation layer (not shown) may be formed using hafnium oxide, zirconium oxide, tantalum oxide, yttrium oxide, niobium oxide, aluminum oxide, titanium oxide, cerium oxide, indium oxide, ruthenium oxide, magnesium oxide, strontium oxide, tin oxide, lead oxide, vanadium oxide, lanthanum oxide and/or calcium oxide. These may be used alone or in a mixture thereof.

A first conductive layer (not shown) and a gate mask layer (not shown) may be successively formed on the gate insulation layer (not shown). The first conductive layer (not shown) may be formed using doped polysilicon. The first conductive layer (not shown) may have a polycide structure that may include a doped polysilicon layer and a metal silicide layer. The gate mask layer (not shown) may be formed using a material that has an etching selectivity relative to a first insulation interlayer 245 successively formed. For example, the gate mask layer (not shown) may be formed using a nitride (e.g., silicon nitride) when the first insulating interlayer 245 is formed using silicon oxide.

After the gate mask layer (not shown) is patterned to form a gate mask (not shown), the first conductive layer (not shown) and the gate insulation layer (not shown) may be patterned using the gate mask as an etching mask. Gate structures 230 may be formed on the substrate 200. Each of the gate structures 230 may include a gate insulation layer pattern, a gate electrode and the gate mask. A silicon nitride layer (not shown) may be formed on the substrate 200 to cover the gate structures 230, and then the silicon nitride layer (not shown) may be anisotropically etched to form gate spacers 225 on sidewalls of the gate structures 230.

Using the gate structures 230 as ion implantation masks, impurities may be implanted into portions of the substrate 200 exposed between the gate structures 230. The implanted impurities may be thermally treated to form a first contact region 235 and a second contact region 240 on the substrate 200. The first and the second contact regions 235 and 240 may correspond to source/drain regions, respectively. The first and the second contact regions 235 and 240 may correspond to a capacitor contact region and a bit line contact region, respectively. A first pad 250 for a capacitor may make contact with the capacitor contact region, whereas a second pad 255 may be located on the bit line contact region. For example, the first contact region 235 may serve as the capacitor contact region and the second contact region 240 may correspond to the bit line contact region. Transistors, including the gate structures 230, gate spacers 225 and the contact regions 235 and 240, may be completed on the substrate 200.

The first insulating interlayer 245 may be formed on the substrate 200 to cover the transistors. The first insulating interlayer 245 may be formed using boro-phosphor silicate glass (BPSG), phosphor silicate glass (PSG), undoped silicate glass (USG), spin on glass (SOG), flowable oxide (FOX), tetraethylorthosilicate (TEOS), plasma-enhanced tetraethylorthosilicate (PE-TEOS) and/or high-density plasma chemical vapor deposition (HDP-CVD) oxide. The first insulating interlayer 245 may be formed by a CVD process, a PECVD process, an ALD process, an HDP-CVD process and/or any other suitable process.

An upper portion of the first insulating interlayer 245 may be removed so that the first insulating interlayer 245 may have a level upper face. The first insulating interlayer 245 may be partially removed by a chemical mechanical polishing (CMP) process, an etch-back process and/or a combination process of CMP and etch-back. In example embodiments, the first insulating interlayer 245 may be partially removed so that the first insulating interlayer 245 may have an upper face with a height that is relatively higher than that of the gate structures 230. In other example embodiments, the first insulating interlayer 245 may be partially removed until the gate structures 230 are exposed such that the first insulating interlayer 245 may have an upper face at substantially the same height as that of the gate structures 230.

Referring now to FIG. 7, the first insulating interlayer 245 may be partially etched by a photolithography process to form a first contact hole (not shown) and a second contact hole (not shown). The first and the second contact holes (not shown) expose the first and the second contact regions 235 and 240, respectively. The first and the second contact holes (not shown) may be formed by a self-alignment process. The first and the second contact holes (not shown) may be self-aligned relative to the gate spacers 225. In some example embodiments, the first contact hole (not shown) may expose the capacitor contact region, whereas the second contact hole (not shown) may expose the bit line contact region. A second conductive layer (not shown) may be formed on the first insulating interlayer 245 to fill the first and the second contact holes (not shown). The second conductive layer may be formed using dope polysilicon, metal and/or conductive metal nitride.

The second conductive layer (not shown) may be partially removed until the first insulating interlayer 245 is exposed to thereby form the first and the second pads 250 and 255 in the first and the second contact holes, respectively. Because the first and the second contact holes may be formed by the self-alignment process, the first and the second pads 250 and 255 may be referred to as self-aligned contact (SAC) pads. The first pad 250 may be positioned on the first contact region 235 and the second pad 255 may be formed on the second contact region 240. Accordingly, the first and the second pads 250 and 255 may make contact with the capacitor and the bit line contact regions, respectively.

A second insulating interlayer 260 may be formed on the first insulating interlayer 245, the first pad 250 and the second pad 255. The second insulating interlayer 260 may electrically insulate the first pad 250 from a bit line 270 (see FIG. 8) successively formed. The second insulating interlayer 260 may be formed using an oxide (e.g., BPSG, PSG, USG, SOG, FOX, TEOS, PE-TEOS and/or HDP-CVD oxide). The second insulating interlayer 260 may be formed by a CVD process, a PECVD process, an HDP-CVD process, an ALD process and/or any other suitable process.

In example embodiments, the second insulating interlayer 260 may be formed using the oxide substantially the same as that of the first insulating interlayer 245. In other example embodiments, the second insulating interlayer 260 may be formed using the oxide different from that of the first insulating interlayer 245. The second insulating interlayer 260 may be planarized by a CMP process, an etch-back process and/or a combination process of CMP and etch-back. A third contact hole 265 may be formed through the second insulating interlayer 260 by a photolithography process. The third contact hole 265 may expose the second pad 255 positioned on the second contact region 240. The third contact hole 265 may be referred to as a bit line contact hole where the bit line 270 is formed.

Figure 8:
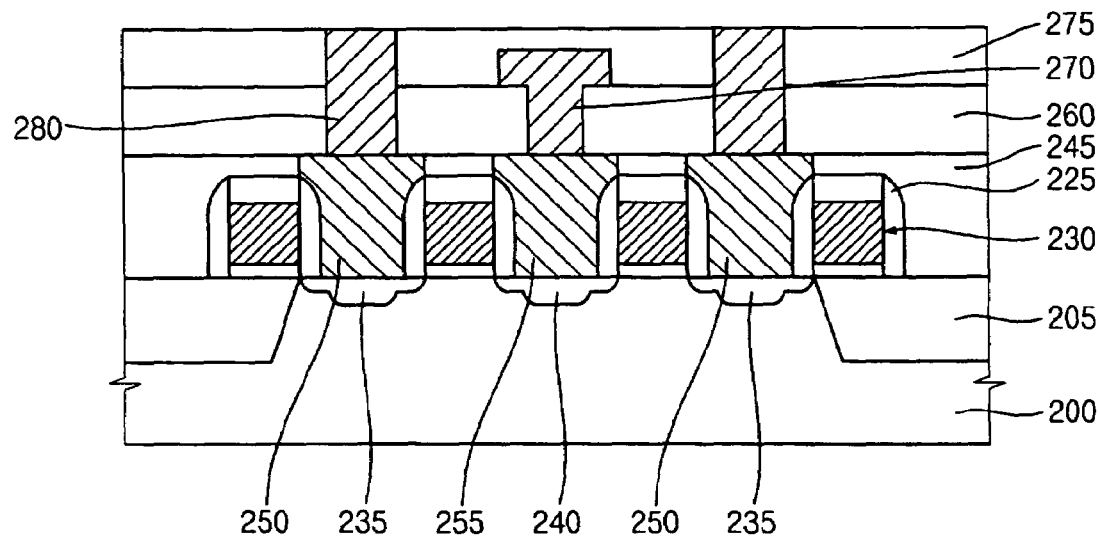

Referring to FIG. 8, a third conductive layer (not shown) may be formed on the second insulating interlayer 260 to fill up the third contact hole 265. The third conductive layer may be partially etched by a photolithography process so that the bit line 270 filling the third contact hole 265 may be formed on the second insulating interlayer 260. The bit line 270 may make contact with the second pad 255. In example embodiments, the bit line 270 may have a multi-layer structure that may include a first layer and a second layer. The first layer may include metal/metal nitride and the second layer may include metal. For example, the first layer may include titanium/titanium nitride and the second layer may include tungsten.

A third insulating interlayer 275 may be formed on the second insulating interlayer 260 to cover the bit line 270. The third insulating interlayer 275 may be formed using an oxide (e.g., BPSG, PSG, SOG, USG, FOX, TEOS, PE-TEOS and/or HDP-CVD oxide). In example embodiments, the third insulating interlayer 275 may be formed using an oxide substantially the same as that of the second insulating interlayer 260. In other example embodiments, the third insulating interlayer 275 may include an oxide different from that of the second insulating interlayer 260.

The third insulating interlayer 275 may be planarized by a CMP process, an etch-back process and/or a combination process of CMP and etch-back. In example embodiments, an additional insulation layer may be formed on the second insulating interlayer 260 to cover the bit line 270. The additional insulation layer may retard or prevent a void from being generated in the third insulating interlayer 275. The additional insulation layer may be formed using a nitride (e.g., a silicon nitride). The third insulating interlayer 275 and the second insulating interlayer 260 may be partially etched by a photolithography process to thereby form a fourth contact hole (not shown). The fourth contact hole may expose the first pad 250 formed on the first contact region 235. The fourth contact hole may correspond to a capacitor contact hole.

A fourth conductive layer (not shown) may be formed on the third insulating interlayer 275 to fill the fourth contact hole. The fourth conductive layer may be formed using metal or polysilicon doped with impurities. The fourth conductive layer may be partially removed until the third insulating interlayer 275 is exposed. A third pad 280 making contact with the first pad 250 may be formed in the fourth contact hole. The third pad 280 may be formed by a CMP process, an etch-back process and/or a combination process of CMP or etch-back. The third pad 280 may electrically connect the first pad to a lower electrode 320 (see FIG. 10) successively formed.

Figure 9:
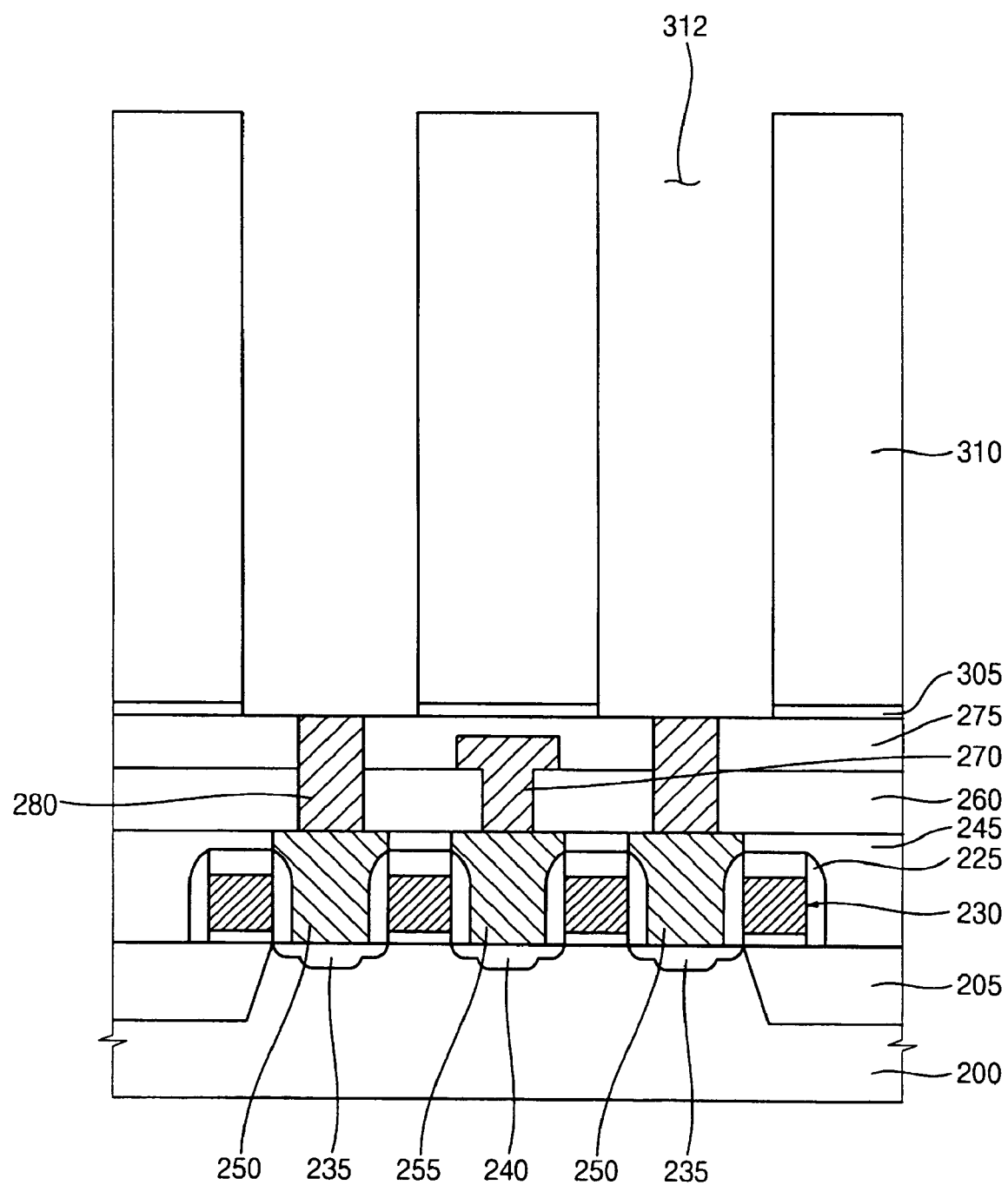

Referring to FIG. 9, an etch stop layer 305 may be formed on the third pad 280 and the third insulating interlayer 275. The etch stop layer 305 may protect the third pad 280 in a successive etching process when forming a hole 312. The etch stop layer 305 may be formed using a material that has an etching selectivity relative to a mold layer 310 and the third insulating interlayer 275. For example, the etch stop layer 305 may be formed using metal oxide and/or nitride. The etch stop layer 305 may have a thickness of about 10 Å to about 200 Å measured from an upper face of the third insulating interlayer 275. The mold layer 310 may be formed on the etch stop layer 305 using an oxide. For example, the mold layer 310 may be formed using BPSG, PSG, USG, SOG, TEOS and/or PE-TEOS oxide. The mold layer 310 may have a thickness of about 10,000 Å to about 20,000 Å. A thickness of the mold layer 310 may vary in accordance with a height of the capacitor because the height of the capacitor may depend on the thickness of the mold layer 310.

A mask pattern (not shown) may be formed on the mold layer 310, and then the mold layer 310 may be partially etched using the mask pattern as an etching mask. The hole 312, partially exposing the etch stop layer 305, may be formed through the mold layer 310. The mold layer 310 may be etched by an anisotropic etching process. The exposed etch stop layer 305 may be successively etched to complete the hole that exposes the third pad 280.

Figure 10:
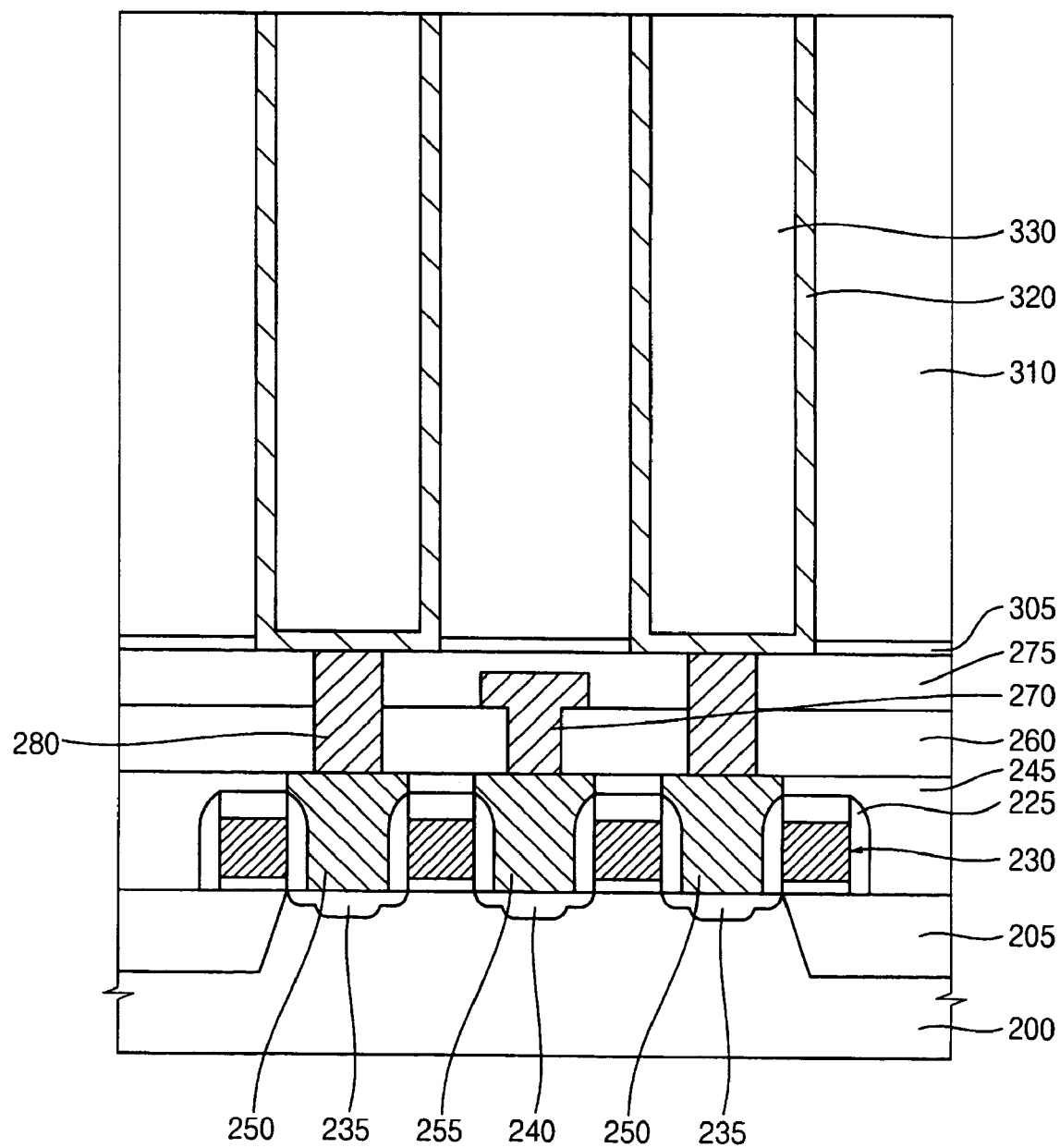

Referring to FIG. 10, a lower electrode layer (not shown) may be formed on the third pad 280, a sidewall of the hole 312 and on the mask pattern. The lower electrode layer may be formed using doped polysilicon and/or a metal (e.g., tungsten and/or titanium). The lower electrode layer may also be formed using a metal nitride (e.g., tungsten nitride and/or titanium nitride). The lower electrode layer may have a thickness of about 300 Å to about 500 Å based on an upper face of the third pad 280.

A buffer layer (not shown) may be formed on the lower electrode layer to fill the hole 312. The buffer layer may be formed using oxide and/or photoresist. When the buffer layer includes photoresist, a first preliminary photoresist film (not shown) may be formed on the lower oxide layer (not shown) by a spin coating process. A first baking process may be performed on the first preliminary photoresist film to form a second preliminary photoresist film (not shown) having an improved adhesion strength relative to the lower electrode layer. An exposure process and a second baking process may be executed on the second preliminary photoresist film to thereby form the buffer layer on the lower electrode layer. The buffer layer, the lower electrode layer and the mask pattern may be polished until the mold layer 310 is exposed such that the lower electrode 320 may be formed on the third pad 280 and the sidewall of the hole 312. A buffer layer pattern 330 may be formed on the lower electrode 320 to fill the hole 312.

Figure 11:
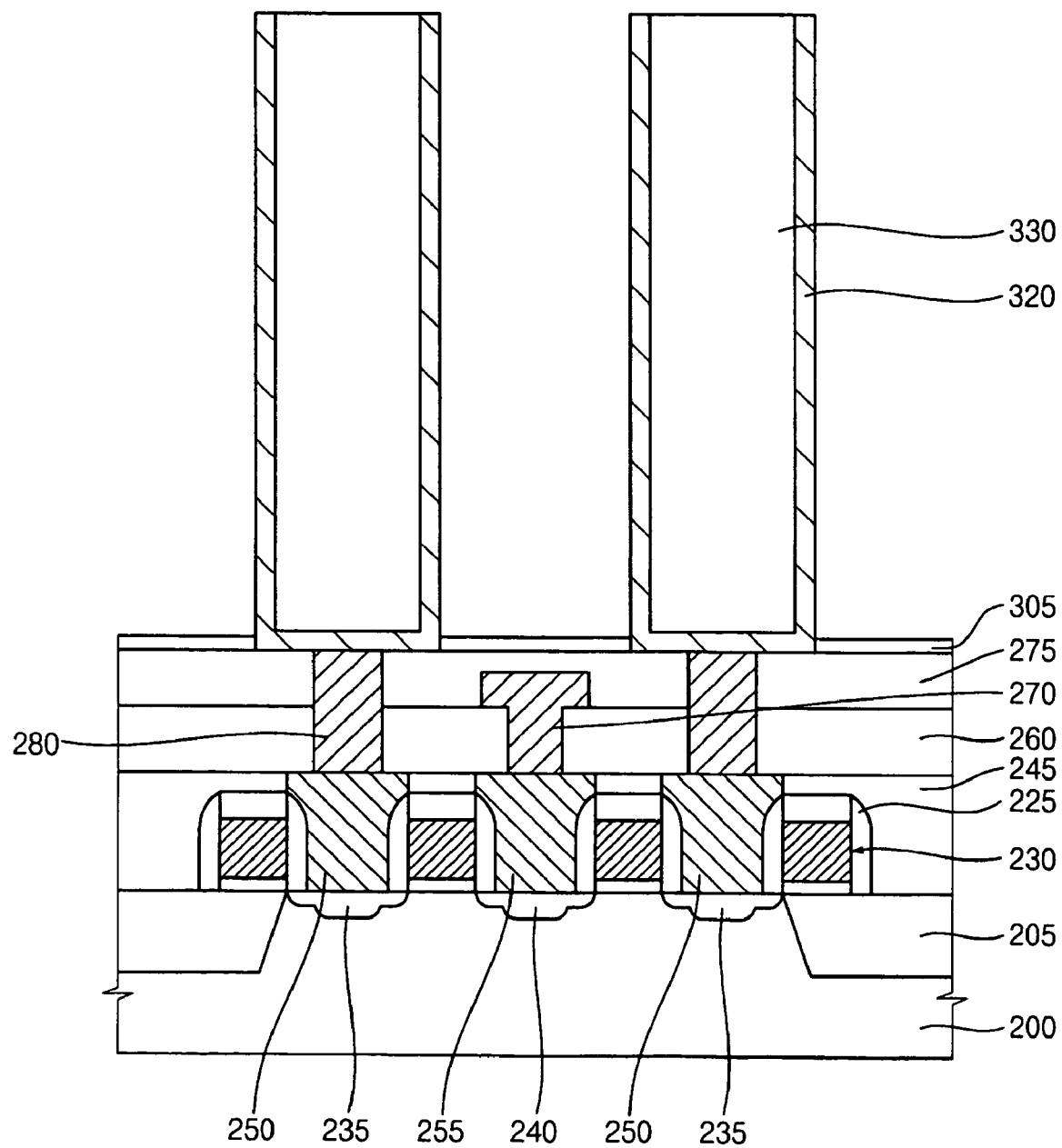

Referring to FIG. 11, the mold layer 310 may be selectively removed from the lower electrode 320 and the etch stop layer 305 so that the lower electrode 320 and the buffer layer pattern 330 protrude from the etch stop layer 305. The mold layer 310 may be removed using an etching solution for etching an oxide. In some example embodiments, the lower electrode 320 may have a cylindrical structure because the lower electrode 320 may be formed on the sidewall of the hole 312 having a cylindrical shape.

Figure 12:
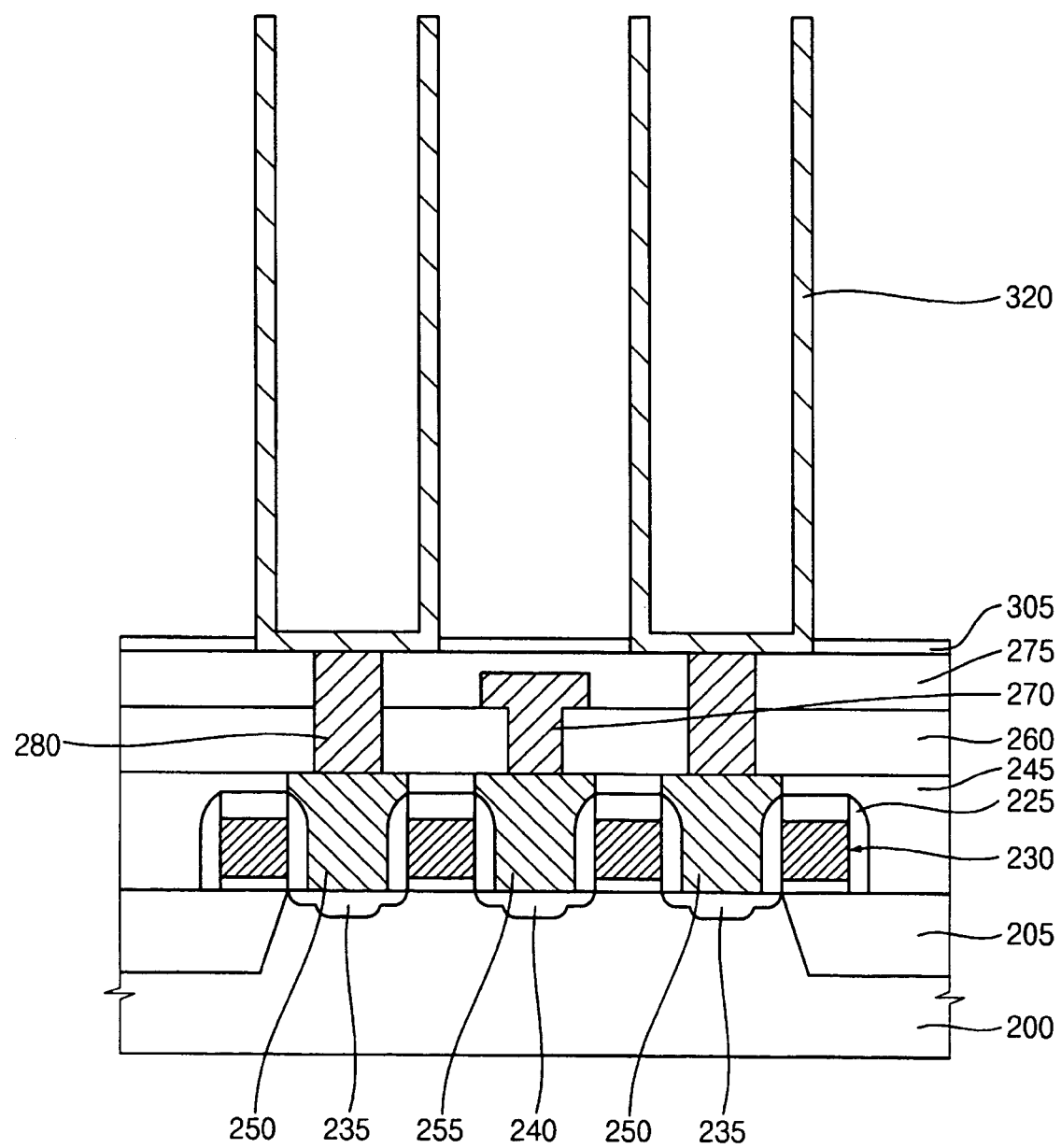

Referring to FIG. 12, the buffer layer pattern 330 may be removed from the lower electrode 320. When the buffer layer pattern 320 includes photoresist, the buffer layer 320 may be removed by an ashing process and/or a stripping process. The lower electrode 320 having the cylindrical structure may be completed on the third pad 280. The third pad 280 may be formed on the first pad 250 so that the lower electrode 320 may be electrically connected to the first contact region 235 through the first and the third pads 250 and 280. In some example embodiments, a plurality of the lower electrodes having relatively high aspect ratios may be adjacent to each other in unit cells of a semiconductor device.

Figure 13:
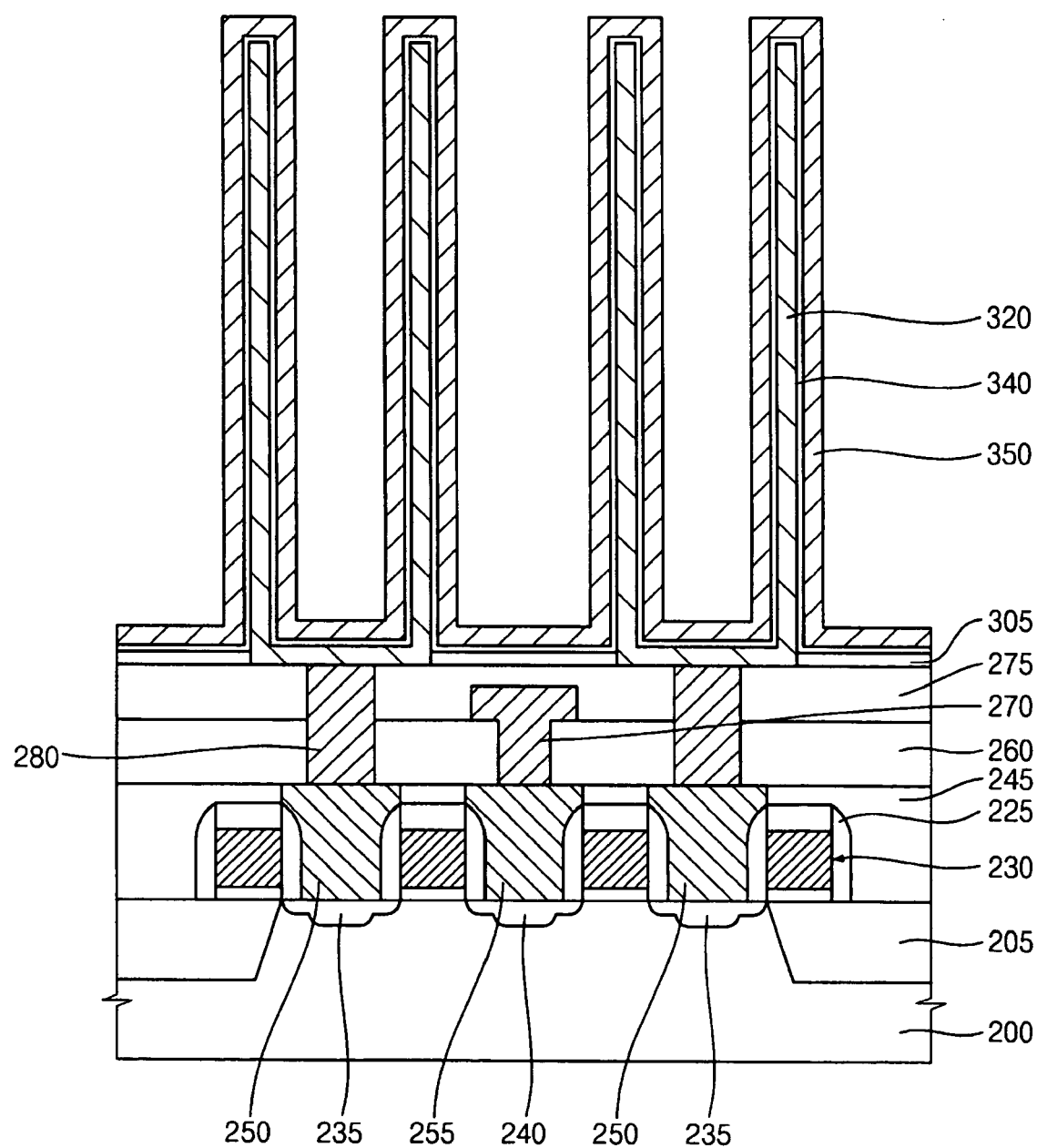

Referring to FIG. 13, a dielectric layer 340 may be formed on the lower electrode 320. In example embodiments, the dielectric layer 340 may include oxide, nitride and/or oxynitride. In other example embodiments, the dielectric layer 340 may have a multi-layer structure that may include an oxide film and a nitride film and/or a first oxide film, a nitride film and a second oxide film. In still other example embodiments, the dielectric layer 340 may be formed using metal oxide (e.g., titanium oxide, hafnium oxide, aluminum oxide, zirconium oxide and/or tantalum oxide) because the metal oxide may have a relatively low equivalent oxide thickness (EOT) and a relatively low leakage current.

When the dielectric layer 340 is formed by an ALD process using the metal oxide, the ALD process may be carried out by providing a reaction material, purging, providing an oxidizing agent and purging again at least once. The dielectric layer 340 may be formed on the cylindrical lower electrode 320. When the dielectric layer 340 includes hafnium oxide, the reaction material may include tetrakis ethyl methyl amino hafnium (Hf[NC$_2$H$_5$CH$_3$]$_4$; TEMAH) and/or hafnium butyl oxide (Hf(O-tBu)$_4$). If the dielectric layer 340 includes aluminum oxide, the reaction material may include trimethyl aluminum (Al(CH$_3$)$_3$; TMA). The oxidizing agent may include ozone (O$_3$), oxygen (O$_2$), water vapor (H$_2$O), oxygen plasma and/or remote oxygen plasma.

A first upper electrode 350 may be formed on the dielectric layer 340. The first upper electrode 350 may be formed using a conductive material (e.g., metal nitride, metal and/or doped polysilicon). In example embodiments, the first upper electrode 350 may be formed by a CVD process using titanium nitride. In the formation of the first upper electrode 350, a reaction gas, including a titanium tetrachloride (TiCl$_4$) gas and an ammonia (NH$_3$) gas, may be provided on the dielectric layer 340 at a temperature below about 550° C.

Figure 14:
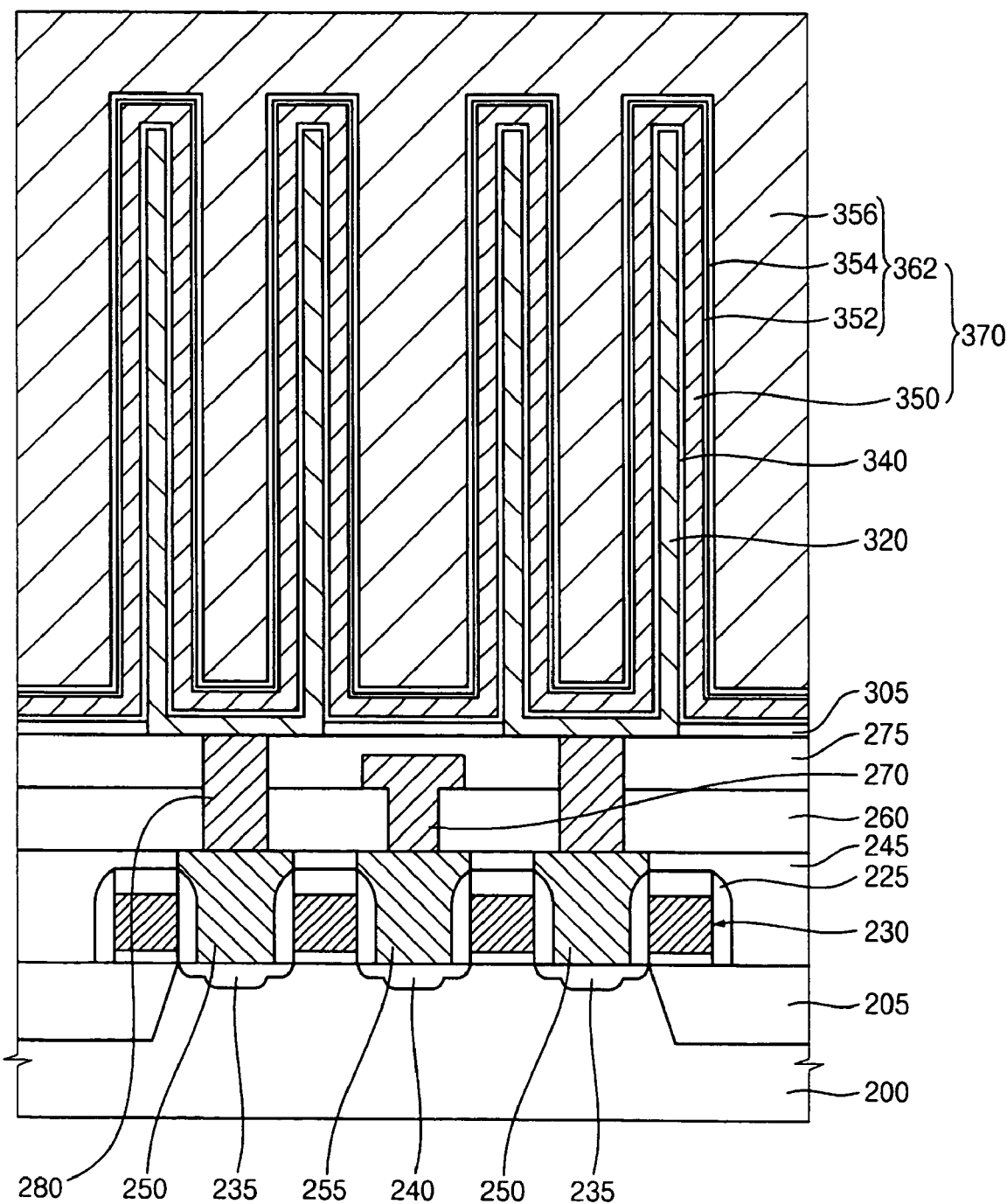

Referring to FIG. 14, a second upper electrode 362 may be formed on the first upper electrode 350 to form an upper electrode structure 370 on the dielectric layer 340. The second upper electrode 362 may include a silicon layer 352, a first silicon germanium layer 354 and a second silicon germanium layer 356 doped with p-type impurities (e.g., boron (B)). When the second upper electrode 362 is formed on the first upper electrode 350, a capacitor, having the lower electrode 320, the dielectric layer 340 and the upper electrode structure 370, may be completed over the substrate 200.

In the formation of the second upper electrode 362 according to example embodiments, the silicon layer 352 serving as a first seed layer may be formed on the first upper electrode 350. The silicon layer 352 may be formed on the first upper electrode 350. The first silicon germanium layer 354 may be more uniformly formed on the silicon layer 352 in-situ using the silicon layer 352 as the first seed layer. The silicon layer 352 and the first silicon germanium layer 354 may be formed by processes substantially the same as those described above. The second silicon germanium layer 356 doped with the p-type impurities may be formed on the first silicon germanium layer 354 in-situ using the first silicon germanium layer 354 as a second seed layer. The p-type second silicon germanium layer 356 may be formed by an LPCVD process using a silicon source gas, a germanium source gas and an impurity source gas (e.g., $BCl_3$ or $B_2H_2$). For example, the second silicon germanium layer 356 may have an impurity concentration of about $1 \times 10^{20}$ ions/cm$^3$ or about $8 \times 10^{20}$ ions/cm$^3$.

Because the second silicon germanium layer 356 is formed on the first silicon germanium layer 354 using the first silicon germanium layer 354 as the second seed layer, grains in the second silicon germanium layer 356 may be relatively small. Generation of voids between the dielectric layer 340 and the upper electrode structure 362 may be reduced. The capacitor may then have improved electrical characteristics.

According to example embodiments, a second upper electrode including a silicon germanium layer doped with p-type impurities may be formed on a first upper electrode using at least one seed layer. An upper electrode structure, having the second and the first upper electrodes, may be formed on a dielectric layer by reducing undesirable growth of grains in the silicon germanium layer doped with the p-type impurities. The upper electrode structure may also be formed on a dielectric layer without generating voids between the dielectric layer and the upper electrode structure. A capacitor and a semiconductor device having the upper electrode structure may have improved electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of forming a capacitor comprising:
    forming a lower electrode on an object;
    forming a dielectric layer on the lower electrode; and
    forming an upper electrode structure on the dielectric layer, including:
        forming a first upper electrode
        forming a second upper electrode, including:
            forming a silicon layer on the first upper electrode;
            forming a first silicon germanium layer on the silicon layer using the silicon layer as a first seed layer; and
            forming a second silicon germanium layer doped with p-type impurities on the first silicon germanium layer using the first silicon germanium layer as a second seed layer.

2. The method of claim 1, wherein forming the second upper electrode of the upper electrode structure is performed in-situ with the first upper electrode.

3. The method of claim 1, wherein the second silicon germanium layer doped with the p-type impurities is formed using an impurity source gas including boron.

4. A method of manufacturing a semiconductor device, comprising:
    forming a contact region on a semiconductor substrate;
    forming at least one pad on the contact region; and
    forming the capacitor according to claim 1 on at least one pad.

* * * * *